US008655469B2

(12) United States Patent
Choi et al.

(10) Patent No.: US 8,655,469 B2
(45) Date of Patent: Feb. 18, 2014

(54) ADVANCED PROCESS CONTROL OPTIMIZATION

(75) Inventors: DongSub Choi, Sungnam (KR); Amir Widmann, Sunnyvale, CA (US); Daniel Kandel, Aseret (IL); David Tien, Santa Clara, CA (US)

(73) Assignee: KLA-Tencor Corporation, Milpitas, CA (US)

(*) Notice: Subject to any disclaimer, the term of this patent is extended or adjusted under 35 U.S.C. 154(b) by 212 days.

(21) Appl. No.: 13/156,865

(22) Filed: Jun. 9, 2011

(65) Prior Publication Data

US 2012/0022679 A1  Jan. 26, 2012

Related U.S. Application Data

(60) Provisional application No. 61/354,377, filed on Jun. 14, 2010.

(51) Int. Cl.
    *G06F 19/00* (2011.01)
(52) U.S. Cl.
    USPC ............................. 700/108; 700/121; 700/110
(58) Field of Classification Search
    USPC ........... 700/108, 110, 121; 438/5; 702/81, 82, 702/83
    See application file for complete search history.

(56) References Cited

U.S. PATENT DOCUMENTS

| 6,567,718 | B1 | 5/2003 | Campbell et al. |
| 6,757,579 | B1* | 6/2004 | Pasadyn ........................ 700/108 |
| 6,970,758 | B1* | 11/2005 | Shi et al. ...................... 700/108 |
| 7,197,722 | B2 | 3/2007 | Wong et al. |
| 7,356,377 | B2* | 4/2008 | Schwarm ...................... 700/108 |
| 2006/0210893 | A1* | 9/2006 | Van Bilsen ..................... 430/30 |
| 2008/0073589 | A1* | 3/2008 | Adel et al. ............... 250/492.22 |
| 2009/0186286 | A1* | 7/2009 | Ausschnitt et al. ............. 430/30 |
| 2010/0228370 | A1* | 9/2010 | Tsen et al. .................... 700/103 |

OTHER PUBLICATIONS

SAS Institute Inc., SAS/STAT 9.2 User's Guide, Chapter 3: Introduction to Statistical Modeling by SAS Institute Inc. 2008. p. 71.*
http://web.archive.org/web/20090501035850/http://weibull.com/DOEWeb/measures_of_model_accuracy_multiple_linear_regression.htm, May 1, 2009.*
Mueller, Thomas, On an Analysis Approach for Improved Linear Overlay Control. 43rd IEEE Conference on Decision and Control. Dec. 2004. vol. 4. pp. 4255-4261.*

* cited by examiner

*Primary Examiner* — Mohammad Ali
*Assistant Examiner* — Emilio J Saavedra
(74) *Attorney, Agent, or Firm* — Suiter Swantz pc llo

(57) ABSTRACT

A method for automatic process control (APC) performance monitoring may include, but is not limited to: computing one or more APC performance indicators for one or more production lots of semiconductor devices; and displaying a mapping of the one or more APC performance indicators to the one or more production lots of semiconductor devices.

15 Claims, 5 Drawing Sheets

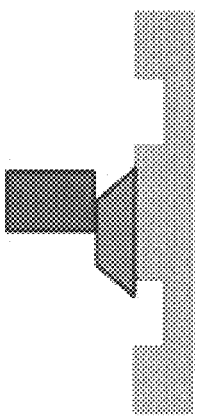
FIG. 5A
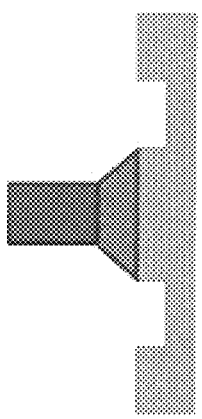
FIG. 5B
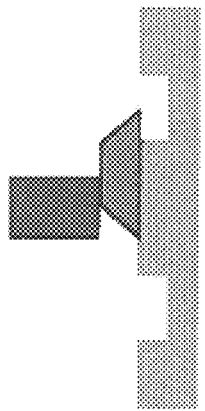
FIG. 5C
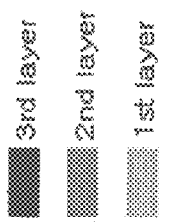

ADVANCED PROCESS CONTROL OPTIMIZATION

CROSS-REFERENCE TO RELATED APPLICATION

This application claims priority to U.S. Provisional Application Ser. No. 61/354,377 filed on Jun. 14, 2010, which is hereby incorporated by reference in its entirety, to the extent not inconsistent herewith.

BACKGROUND

Advanced process control (APC) systems are presently used to predict process corrections for photolithographic devices (e.g. steppers, scanners and the like) by calculating overlay model parameters from various production lots of semiconductor devices. However, current methodologies for determining the performance of such APC systems may merely include analysis of such production lots. Using such methods may result in the consideration of errors introduced independently of the APC algorithms (e.g. tool errors, metrology errors, and the like). As such, an accurate measure of APC performance may be difficult to obtain from simple final production lot analysis. As such, a need exists to determine the relative performance of APC independent from other process variables.

SUMMARY OF THE INVENTION

A method for automatic process control (APC) performance monitoring may include, but is not limited to: computing one or more APC performance indicators for one or more production lots of semiconductor devices; and displaying a mapping of the one or more APC performance indicators to the one or more production lots of semiconductor devices.

BRIEF DESCRIPTION OF THE DRAWINGS

Further advantages of the present invention may become apparent to those skilled in the art with the benefit of the following detailed description of the preferred embodiments and upon reference to the accompanying drawings in which FIG.:

1 illustrates a photolithographic device fabrication system;
2 illustrates overlay error data and an APC performance indicator computed therefrom;
3A illustrates a mapping of APC performance indicator values according to photolithographic technology type, photolithographic fabrication device type, and semiconductor layer;
3B illustrates overlay error data and an APC performance indicator computed therefrom;
4A illustrates control model parameter inputs over semiconductor production lots;
4B illustrates control model parameter inputs grouped according to the order of their response signature in a semiconductor device;
5A a first overlay configuration of semiconductor layers;
5B a second overlay configuration of semiconductor layers;
5C a third overlay configuration of semiconductor layers.

Figure 1:
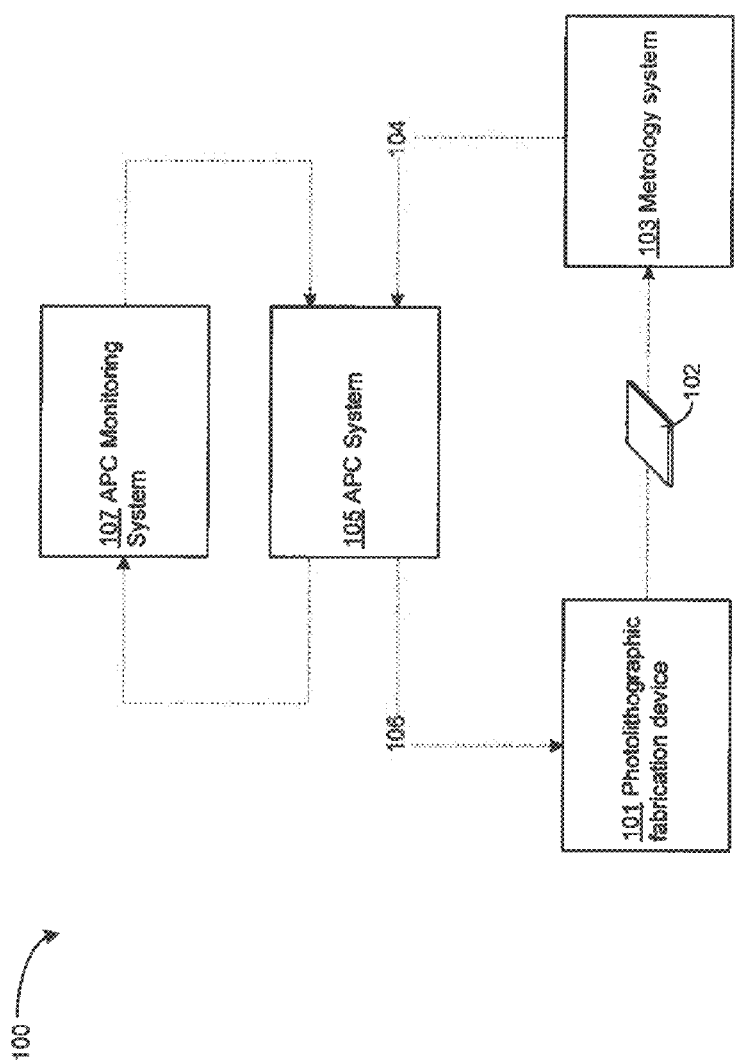

While the invention may be subject to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The present invention generally relates to systems and methods for automatic process control (APC) of photolithographic systems. More particularly, the present invention relates to systems and methods for determining the performance characteristics of an APC system, monitoring the predicted process model parameters generated by the APC system, and optimizing one or more process control parameters.

Referring to FIG. 1, a photolithographic device fabrication system 100 is shown. The photolithographic device fabrication system 100 may include a photolithographic fabrication device 101. The photolithographic fabrication device 101 may include a stepper or scanner-type photolithographic device configured to dispose one or more process layers on a substrate to generate a semiconductor device 102.

The photolithographic device fabrication system 100 may further include a metrology system 103. A semiconductor device 102 fabricated by the photolithographic fabrication device 101 may be provided to a metrology system 103. The metrology system 103 may perform one or more metrological inspections (e.g. process layer overlay error determination) to determine the quality of the photolithographic processes employed by the photolithographic fabrication device 101. The metrology system 103 may generate metrology data 104 (e.g. overlay error values) indicative of the metrological inspection of the semiconductor device 102.

The photolithographic device fabrication system 100 may further include an APC system 105. The APC system 105 may monitor the performance of the photolithographic fabrication device 101 and automatically adjust one or more process parameters (e.g. translation, rotation, magnification, dose, focus, and the like) to optimized the performance of the photolithographic fabrication device 101. Specifically, the APC system 105 may receive metrology data 104 from the metrology system 103, analyze the performance of the photolithographic fabrication device 101 as evidenced by the metrology data 104, and provide one or more process control parameters 106 to the photolithographic fabrication device 101.

Current APC systems may calculate overlay model parameters for use in configuring photolithographic devices based on analysis of production lots of semiconductor devices. Using such systems may result in the consideration of error contributions that are independent of the APC algorithms (e.g. internal fabrication tool errors, metrology errors, and the like). As such, such systems may fail to provide an accurate isolated view of the performance of the APC systems.

In order to address such deficiencies, the APC system 105 of the photolithographic device fabrication system 100 may include an APC monitoring system 107. The APC monitoring system 107 may monitor the metrology data 104 from the metrology system 103 to determine the impact that the process modeling and estimation operations of the APC system 105 have on photolithographic process performance. Specifically, it may be the case that the APC monitoring system 107 may compute an APC performance indicator. The APC performance indicator may be a measure of impact that the performance of the modeling and estimation operations of the APC system 105 have on the semiconductor devices 102 fabricated according to those modeling and estimation operations. For example, the APC monitoring system 107 may receive historical data regarding overlay error data detected by the metrology system 103. This historical data may be correlated with the computed APC process control parameters 106 generated by the APC system 105 and provided to the photolithographic fabrication device 101 in order to fabricate the semiconductor device 102 having the metrology data 104.

For example, an APC performance indicator may be computed by an APC monitoring system 107. An APC performance indicator may include an absolute value of the difference between raw overlay error data associated with a production lot and a residual overlay value (e.g. the overlay portion remaining following model fitting) computed from an overlay control model by the APC system 105 in determining the process control parameters to be provided to the photolithographic fabrication device 101. Specifically, if a linear control model is employed, a linear residual may be employed.

Still further, a combined APC performance indicator may take into account both the residuals and the overlay specification (e.g. a user defined allowable overlay margin for a given device). For example, FIG. 2 illustrates various metrics representative of the performance characteristics of three photolithographic processes A, B and C.

Figure 2:
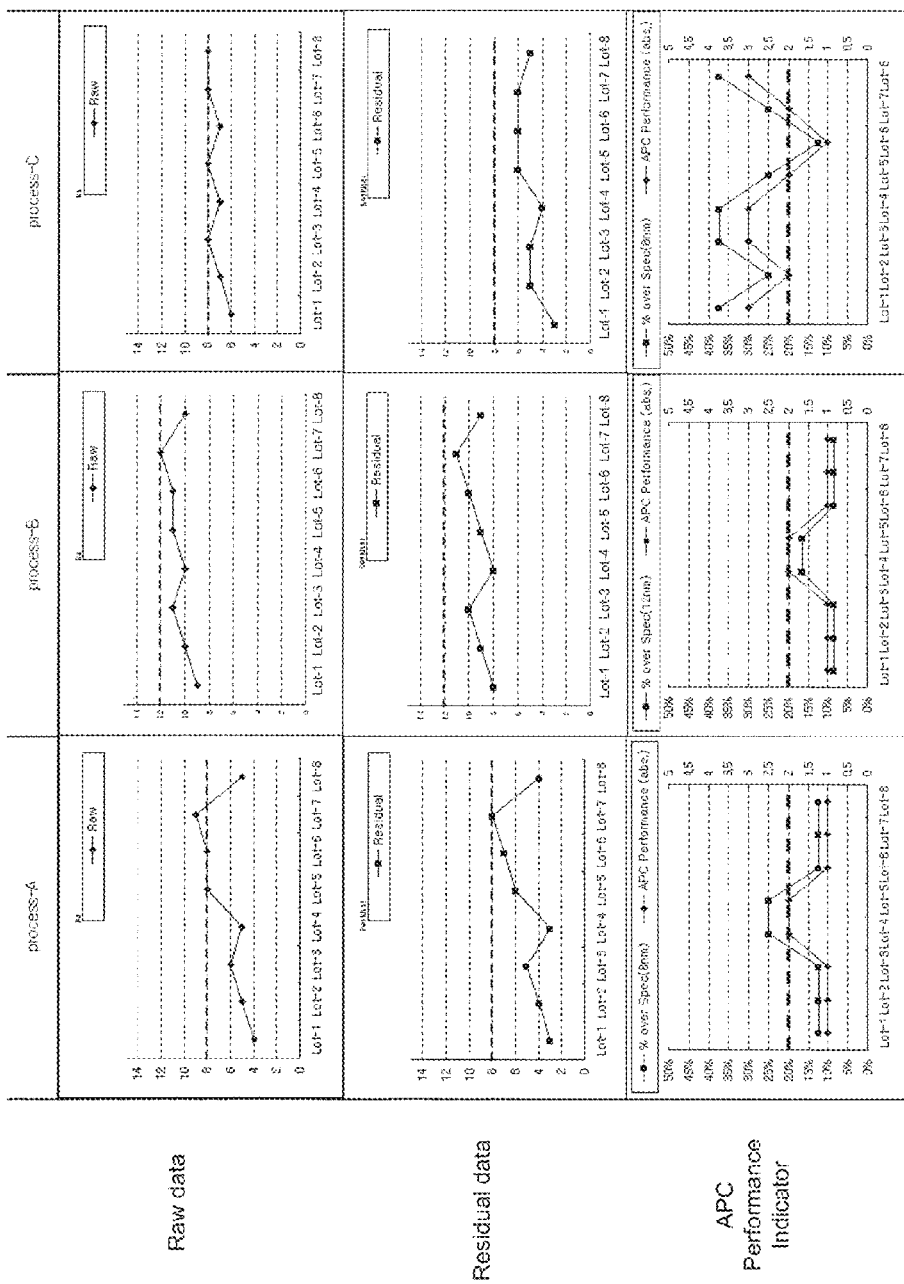

The first row of charts of FIG. 2 illustrates the raw data representative of the overlay errors detected across various production lots. The second row of charts of FIG. 2 illustrates the residual computed for various production lots.

The third row of charts of FIG. 2 illustrates the inventive APC performance indicator. As shown in FIG. 2, the APC performance indicator may be computed as the absolute value of the difference between the raw overlay error data and the computed residual data. For example, for lots 1-8 of Process A, the APC performance indicators are 1, 1, 1, 2, 2, 1, 1 and 1, respectively. For lots 1-8 of Process B, the APC performance indicators are 1, 1, 1, 2, 2, 1, 1 and 1, respectively. For lots 1-8 of Process C, the APC indicators are 3, 2, 3, 3, 2, 1, 2 and 3, respectively. As can be seen, the APC indicators for Process C indicate poor APC performance for that process (e.g. wide variation and greater APC indicator values).

Additionally, the third row of charts of FIG. 2 illustrates the percentage overlay spec.

Figures 3A, 3B:
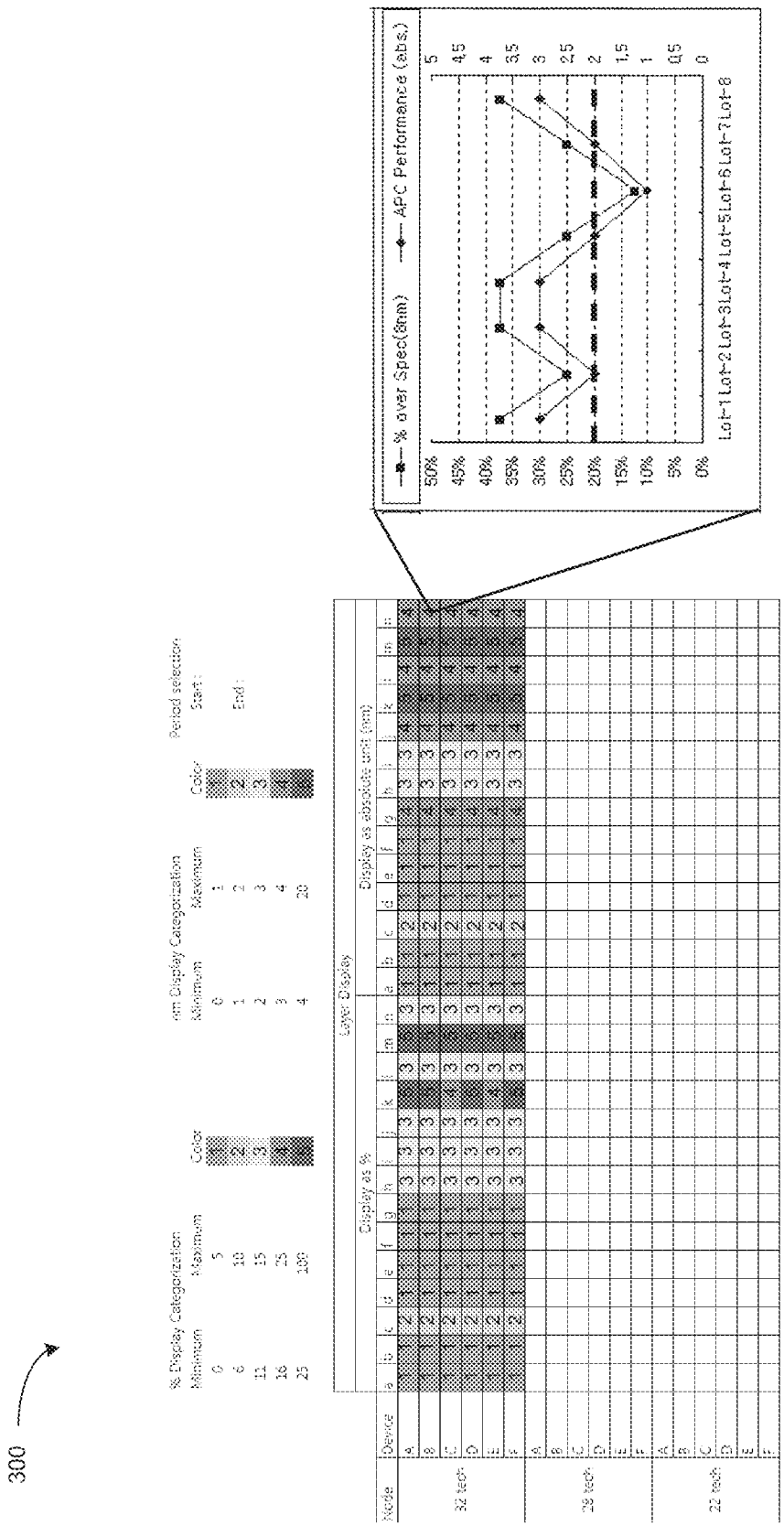

The APC performance indicator methods described above may be extended to the various photolithographic technologies (e.g. 22 nm technologies, 28 nm technologies, 32 nm technologies, and the like), devices (e.g. DRAM, Flash, MPU and the like) and process layers of a photolithographic process for a given semiconductor process. For example, as shown in FIG. 3A, a graphical user interface 300 may be provided (e.g. displayed on a display device) by the APC monitoring system 107. As shown in FIG. 3A, varying APC performance indicator levels may be accorded specific colors within a spectrum. For example, APC performance indicator values between 0 and 1 nm may be green, APC performance indicator values between 1 and 2 nm may be light blue, APC performance indicator values between 2 and 3 nm may be yellow, APC performance indicator values between 3 and 4 nm may be dark blue and APC performance indicator values greater than 4 nm may be red.

FIG. 3B illustrates a plot of the APC performance indicator values for a given photolithographic technology (e.g. 32 nm technology) running on a given photolithographic device (e.g. device "B") for a given process layer (e.g. Process layer "n") over a series of production lots. As shown in FIG. 3B, the maximum value of the APC performance indicator over the subject production lots is 3. As such, in the graphical user interface 300 of FIG. 3A, the field associated with 32 nm photolithographic technology on device "B" for process layer "n" is shown in dark blue.

Accordingly, the graphical user interface 300 may present a comprehensive map of APC performance for all photolithographic device fabrication systems 101. Such a map may permit a user to view trends in APC performance data and take corrective action. For example, as shown in FIG. 3, all fields associated with process layers "k" and "m" indicate poor APC performance, regardless of device (e.g. a device independent performance issue). Alternately, the percentage view (e.g. APC prediction error/overlay specification value) associated with layer "k" shows varying levels of APC performance across multiple devices.

Upon determination of a poor APC performance as described above, it may be desirable account for correlations between various fabrication process control parameters such that the impact of those parameters on APC performance may be determined and adjusted to optimize APC performance.

Traditional methods for monitoring high-order error response signatures on wafers involve monitoring individual control model parameters. However, the simultaneous monitoring of multiple parameters may become impractical. For example, the $3^{rd}$-order grid model may involve 20 control model parameters.

Instead, the quantity (e.g. mean+3sigma of a modeled parameter) of the model may be monitored. For example, a second-order response signature may computed as:

$$2^{nd} \text{ order response signature} = \text{linear residual} - 2^{nd} \text{ order residual}$$

while a third-order response signature may be computed as:

$$3^{rd} \text{ order response signature} = 2^{nd} \text{ order residual} - 3^{rd} \text{ order residual}$$

Such calculations may be used due to the correlations between control model parameters, especially between linear and $3^{rd}$ order parameters. The reason for order separation is that specific order is often related to a specific process change. For example, thermal process changes often generate $2^{nd}$ order response signatures. Therefore, such order separation monitoring may allow for specific process monitoring for process changes that result in high order response signatures in production wafers.

In order to simplify data for analysis, correctables in each group can be combined into a reduced set of parameters. For example, a set of correlated parameters may be transformed into a smaller set of uncorrelated parameters by orthogonal linear transformation where a single variable is utilized to account for as much of the variability in a subject data set as possible. Employing such a method may allow for the reduction of parameters to a more manageable level.

Figures 4A, 4B:
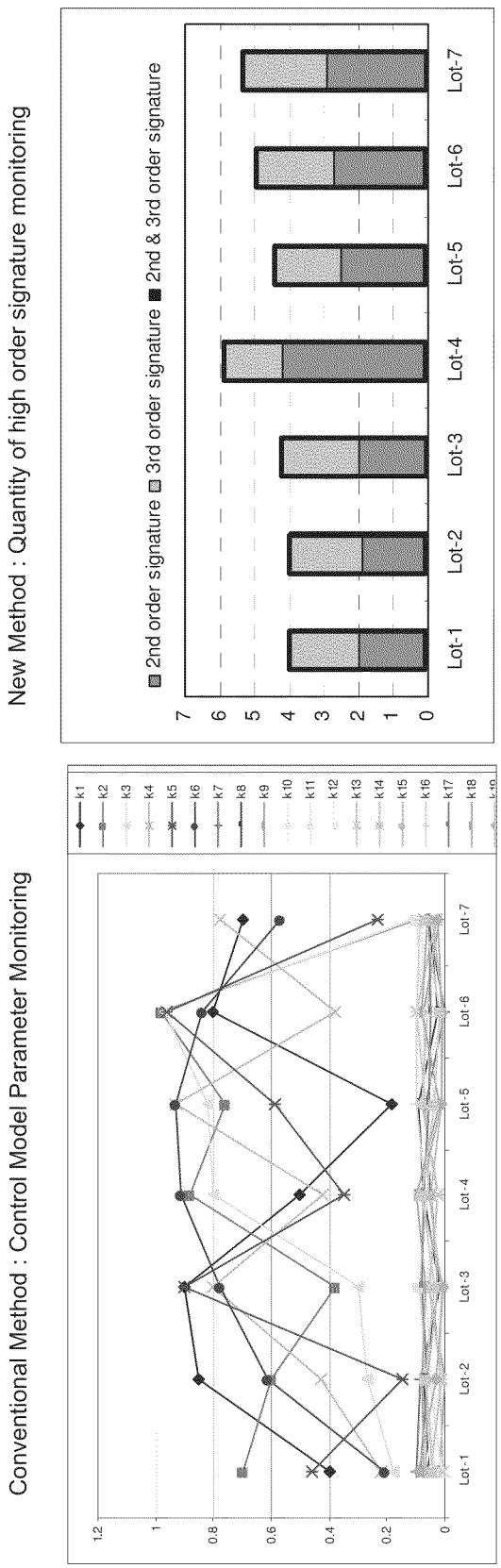

For example as shown in FIG. 4A, plots of 20 different process control model parameters employed over 7 production lots is shown. Alternately, as shown in FIG. 4B, those 20 process control parameters are grouped according to their order and the combined values are presented. For example, as shown in 4B, those process control model parameters having a $2^{nd}$ order response signature are combined and represented by a portion of a bar graph element. Similarly, those process control parameters having a $3^{rd}$ order response signature are combined and represented by a second portion of the bar graph element. The total value represented by the bar graph element is the total of the $2^{nd}$ order and $3^{rd}$ order process control parameters. As can be seen from FIG. 4B, with respect to Lot-4, process control parameters having a $2^{nd}$ order response signature account for a greater percentage of the total process control parameters. As such, the trend chart of FIG. 4B may assist a user in determining a root-cause of a process response signature (e.g. process tools, recipes, and the like).

Still further, APC process model prediction performance may be enhanced through use of reference overlay feed-forward methodologies for a given lot. Referring to FIGS. 5A, 5B and 5C, various overlay conditions are shown for a first layer, second layer and a third layer.

Traditional method of overlay correction prediction may be defined by:

Overlay(predicted:next layer)=Overlay(input:current layer)−Overlay(measured:current layer)

where Overlay(input:current layer) is overlay computed according to model parameters for a given layer and Overlay (measured:current layer) is an overlay measured at a metrology tool.

However, this method does not account for any overlay errors found in a preceding reference layer. For example, as shown in FIGS. 5A, 5B and 5C, a reference layer (e.g. the 2nd layer) may be minus-shifted, aligned or plus-shifted, respectively, relative to a subject layer (e.g. the $3^{rd}$ layer). Traditional APC prediction may provide the same process correction recommendation for all three conditions as the overlay correction prediction is based only on the characteristics of the 3rd layer itself.

Instead, it may be advisable to incorporate the overlay result associated with the reference layer into the computation of the prediction calculation for the current layer:

Overlay(predicted:next layer)=Overlay(input:current layer)−Overlay(measured:current layer)−Overlay (measured:reference layer)*k where k is a weighting factor.

Specifically, in computing a predicted process correction for a $4^{th}$ layer to be disposed over the $3^{rd}$ layer, the prediction calculation may be:

Overlay(predicted:$4^{th}$ layer)=Overlay(input:$3^{rd}$ layer)−Overlay(measured:$3^{rd}$ layer)−Overlay (measured:$2^{nd}$ layer)*k As described above, Further modifications and alternative embodiments of various aspects of the invention may be apparent to those skilled in the art in view of this description. For example, methods and systems for extending the detection range of an inspection system are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for automatic process control (APC) performance monitoring comprising:

receiving overlay error data associated with at least one metrology inspection of one or more semiconductor devices fabricated by a semiconductor fabrication device controlled according to an overlay control model;

computing at least one residual overlay value according to the overlay control model;

computing a variance between the overlay error data associated with the one or more semiconductor devices and the residual overlay value computed from the overlay control model;

displaying a mapping of the variance between the overlay error data and the residual overlay value to the one or more semiconductor devices.

2. The method of claim 1, wherein the overlay control model is a linear overlay control model; and wherein the residual overlay value is a linear residual overlay value.

3. The method of claim 1, further comprising:

monitoring process control parameters associated with 2nd-order or greater response signatures in the semiconductor devices;

aggregating process control parameter values according to the order of their response signatures in the semiconductor devices; and displaying the aggregated process control parameter values.

4. The method of claim 1, further comprising:

computing an overlay correction estimation for a first layer.

5. The method of claim 4, wherein the computing an overlay correction estimation for a first layer comprises:

computing an overlay correction estimation for a first layer from a previous layer and a reference layer.

6. A system for automatic process control (APC) performance monitoring comprising:

a computing device configured for:

receiving overlay error data associated with at least one metrology inspection of one or more semiconductor devices fabricated by a semiconductor fabrication device controlled according to an overlay control model, computing at least one residual overlay value according to the overlay control model, computing a variance between the overlay error data associated with the one or more semiconductor devices and the residual overlay value computed from the overlay control model; and a display device configured for displaying a mapping of the variance between the overlay error data and the residual overlay value to the one or more semiconductor devices.

7. The system of claim 6, wherein the overlay control model is a linear overlay control model; and wherein the residual overlay value is a linear residual overlay value.

8. The system of claim 6, wherein the computing device is further configured for:

monitoring process control parameters associated with 2nd-order or greater response signatures in the semiconductor devices;

aggregating process control parameter values according to the order of their response signatures in the semiconductor devices; and wherein the display device is further configured for:

displaying the aggregated process control parameter values.

9. The system of claim 6, wherein the computing device if further configured for:

computing an overlay correction estimation for a first layer.

10. The system of claim 9, wherein the computing an overlay correction estimation for a first layer includes:
   computing an overlay correction estimation for a first layer from a previous layer and a reference layer.

11. A non-transitory computer-readable medium including computer readable instructions that, when executed by a computing device cause the computing device to perform a process for automatic process control (APC) performance monitoring comprising:
   receiving overlay error data associated with at least one metrology inspection of one or more semiconductor devices fabricated by a semiconductor fabrication device controlled according to an overlay control model;
   computing at least one residual overlay value according to the overlay control model;
   computing a variance between the overlay error data associated with the one or more semiconductor devices and the residual overlay value computed from the overlay control model; and
   displaying a mapping of the variance between the overlay error data and the residual overlay value to the one or more semiconductor devices.

12. The non-transitory computer-readable medium of claim 11,
   wherein the overlay control model is a linear overlay control model; and
   wherein the residual overlay value is a linear residual overlay value.

13. The non-transitory computer-readable medium of claim 11, further comprising:
   monitoring process control parameters associated with 2nd-order or greater response signatures in the semiconductor devices;
   aggregating process control parameter values according to the order of their response signatures in the semiconductor devices; and
   displaying the aggregated process control parameter values.

14. The non-transitory computer-readable medium of claim 11, further comprising:
   computing an overlay correction estimation for a first layer.

15. The non-transitory computer-readable medium of claim 14, wherein the computing an overlay correction estimation for a first layer comprises:
   computing an overlay correction estimation for a first layer from a previous layer and a reference layer.

* * * * *